United States Patent
Coric

(10) Patent No.: US 11,159,132 B2
(45) Date of Patent: Oct. 26, 2021

(54) CLASS D AMPLIFIER STEREO TO MONO CONVERTER

(71) Applicant: Bose Corporation, Framingham, MA (US)

(72) Inventor: Zoran Coric, Framingham, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/246,085

(22) Filed: Jan. 11, 2019

(65) Prior Publication Data

US 2020/0228072 A1    Jul. 16, 2020

(51) Int. Cl.
    *H03F 3/217*    (2006.01)
    *H03F 3/185*    (2006.01)
    *H03F 1/02*     (2006.01)
    *H03F 3/68*     (2006.01)

(52) U.S. Cl.
    CPC .......... *H03F 3/185* (2013.01); *H03F 1/0205* (2013.01); *H03F 3/2171* (2013.01); *H03F 3/2173* (2013.01); *H03F 3/2178* (2013.01); *H03F 3/68* (2013.01)

(58) Field of Classification Search
    CPC .......... H03F 3/185; H03F 3/2178; H03F 3/68; H03F 1/0205; H03F 3/2171; H03F 3/2173
    USPC .............................. 330/10, 251, 207 A, 271
    See application file for complete search history.

(56) References Cited

U.S. PATENT DOCUMENTS

| 8,022,756 | B2 * | 9/2011 | Walker .................. H03F 3/217 330/10 |
| 9,264,000 | B2 | 2/2016 | Nussbaum et al. |
| 9,379,679 | B2 | 6/2016 | Noro |
| 9,647,612 | B2 * | 5/2017 | Watanabe ................ H03F 1/30 |

(Continued)

FOREIGN PATENT DOCUMENTS

| EP | 1323231 | 7/2003 |
| JP | 2009141915 | 6/2009 |

(Continued)

OTHER PUBLICATIONS

International Search Report and Written Opinion in International Appln. No. PCT/US2020012881, dated Apr. 17, 2020, 12 pages.

*Primary Examiner* — Khanh V Nguyen
*Assistant Examiner* — Khiem D Nguyen
(74) *Attorney, Agent, or Firm* — Fish & Richardson P.C.

(57) ABSTRACT

The technology described in this document can be embodied in an audio power amplifier that includes a first channel and a second channel. Each of the first channel and the second channel includes an input to receive an input signal, a pair of switching devices, drive circuitry for driving the pair of switching devices to produce a signal, and an output filter to filter the signal from the pair of switching devices. The output filter is configured to provide the filtered signal to an audio load. Each of the first channel and the second channel includes a voltage feedback loop to provide a voltage of the filtered signal to a voltage controller of the audio power amplifier, and a current feedback loop to provide a current of the filtered signal to a current controller of the audio power amplifier. The audio power amplifier includes a summer for combining the input of the first channel and the input of the second channel when an output of the first channel is connected to an output of the second channel.

18 Claims, 13 Drawing Sheets

(56) References Cited

U.S. PATENT DOCUMENTS

2012/0230519 A1 9/2012 Nussbaum et al.
2015/0214906 A1 7/2015 Wordinger

FOREIGN PATENT DOCUMENTS

JP 5336635 11/2013
KR 101248181 3/2013

* cited by examiner

CLASS D AMPLIFIER STEREO TO MONO CONVERTER

TECHNICAL FIELD

This disclosure relates to feedback for a versatile audio power amplifier.

BACKGROUND

Switching amplifiers, also called Class D amplifiers, amplify an input signal by modulating that signal into a series of pulses that drive a complementary pair of transistors operated in the switching mode. The transistors alternately couple positive and negative power sources to the output, which in total produce an amplified representation of the input signal.

SUMMARY

In one aspect, this document describes an audio power amplifier that includes a first channel and a second channel. Each of the first channel and the second channel includes an input to receive an input signal, a pair of switching devices, drive circuitry for driving the pair of switching devices to produce a signal, and an output filter to filter the signal from the pair of switching devices. The output filter is configured to provide the filtered signal to an audio load. Each of the first channel and the second channel includes a voltage feedback loop to provide a voltage of the filtered signal to a voltage controller of the audio power amplifier, and a current feedback loop to provide a current of the filtered signal to a current controller of the audio power amplifier. The audio power amplifier includes a summer for combining the input of the first channel and the input of the second channel when an output of the first channel is connected to an output of the second channel.

Implementations can include one or more of the following features. The first channel input and second channel input may not be combined when the output of the first channel is not connected to the output of the second channel. An average of the first channel input signal and second channel input signal may be output by the audio power amplifier when an output of the first channel is connected to the output of the second channel. The input signal to the input of the first channel may be a first stereo input signal, and the input signal to the input of the second channel may be a second stereo input signal. A signal representing a mode of the amplifier may be used to control the summer for combining the input of the first channel and the input of the second channel. The signal representing the mode of the amplifier may be used to connect the output of the first channel and the output of the second channel. The signal representing the mode of the amplifier may be used to provide a current control signal from the first channel to the second channel. Each of the first channel and the second channel may further comprise a self-oscillating feedback loop to provide a timing signal for driving the corresponding pair of switching devices. The self-oscillating feedback loop may be integrated into the current feedback loop. The audio power amplifier may be a Class D amplifier.

In another aspect, this document features an audio power amplifier that includes a first channel and a second channel. Each of the first channel and the second channel includes an input to receive an input signal, a pair of switching devices, drive circuitry for driving the pair of switching devices to produce a signal, and an output filter to filter the signal from the pair of switching devices. The output filter is configured to provide the filtered signal to an audio load. Each of the first channel and the second channel includes a voltage feedback loop to provide a voltage of the filtered signal to a voltage controller of the audio power amplifier, and a current feedback loop to provide a current of the filtered signal to a current controller of the audio power amplifier. The audio power amplifier includes a controller for placing the audio power amplifier into a stereo mode or a mono mode.

Implementations can include one or more of the following features. When the amplifier is placed into the stereo mode, the first channel may operate independent of the second channel. When the amplifier is placed into the mono mode, the input of the first channel and the input of the second channel may be combined. An average of the first channel input signal and second channel input signal may be output by the audio power amplifier when the amplifier is placed into the mono mode. When the amplifier is placed into the mono mode, the output of the first channel may be connected to the output of the second channel. When the amplifier is placed into the mono mode, a current control signal from the first channel may be provided for use by the second channel. When the amplifier is placed into the stereo mode, one current control signal may be produced and used by the first channel and another current control signal may be produced and used by the second channel. Each of the first channel and the second channel may further comprise a self-oscillating feedback loop to provide a timing signal for driving the corresponding pair of switching devices. The self-oscillating feedback loop may be integrated into the current feedback loop. The audio power amplifier may be a Class D amplifier.

Various implementations described herein may provide one or more of the following advantages. Through the presented design, a class D amplifier can include a current feedback loop for controlling the output current of the amplifier. Additionally functionality can be integrated into the current feedback loop; for example, an integrated switching loop can use signal artifacts present in the current feedback loop to provide a self-oscillating loop. By using the signal artifacts, a dedicated reference waveform does not need to be independently generated, thereby conserving electronic component cost, real estate, etc.

Two or more of the features described in this disclosure, including those described in this summary section, may be combined to form implementations not specifically described herein.

The details of one or more implementations are set forth in the accompanying drawings and the description below. Other features, objects, and advantages will be apparent from the description and drawings, and from the claims.

DETAILED DESCRIPTION

Figure 1B:
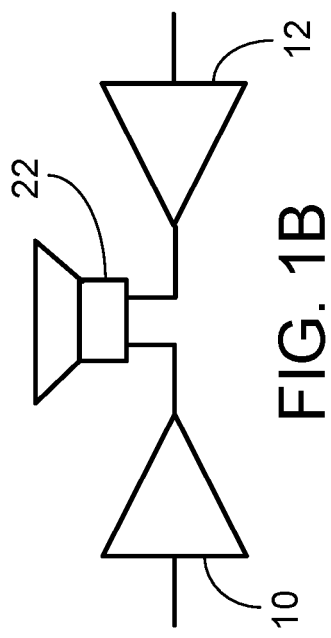
FIGS. 1A, 1B, 1C and 1D show block diagrams of amplifier-speaker topologies.

Power amplifiers may be connected to their loads in a number of topologies, depending on the nature and intended use of the loads. FIGS. 1A through 1D show four topologies for connecting power amplifiers to loudspeakers. In FIG. 1A, a single amplifier 10 drives a loudspeaker 20 by providing power to one terminal of the loudspeaker, while the other terminal is grounded. This is a typical configuration sometimes referred to as a "half-bridge." In FIG. 1B, a "full-bridge" configuration is shown, where two amplifiers 10 and 12 are used, one connected to each terminal of the loudspeaker 22. The second amplifier 12 is driven with an inverse of the signal to the first amplifier 10, so the total voltage across the loudspeaker 22 is doubled, while the current remains the same as that in the half-bridge configuration. By providing twice the voltage, this configuration can drive loudspeakers with double impedance at the same current. It can provide more power total, or the same power with less dissipation per amplifier. This mode of operation is ubiquitous in the audio amplifier field, and is often referred to as 'BTL' (bridge tied load) configuration.

Figure 1D:
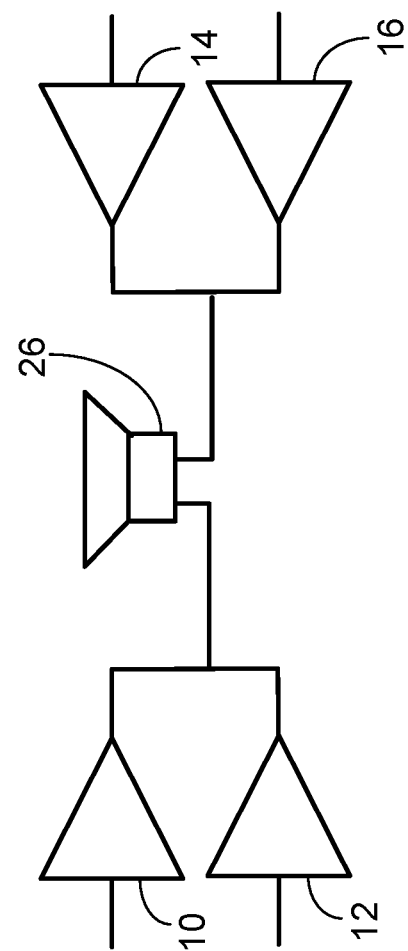
Figure 1A:
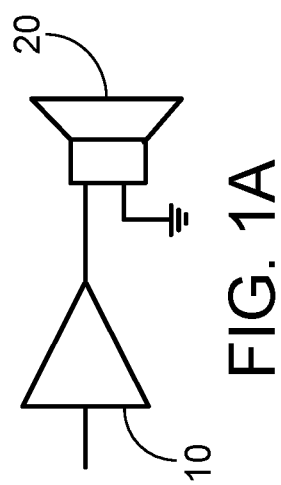
Figure 1C:
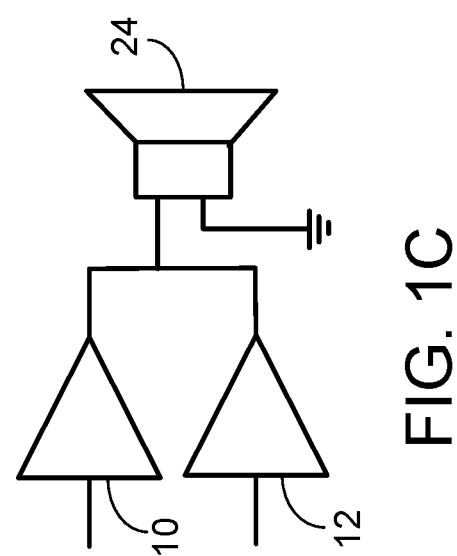

In FIG. 1C, the two amplifiers 10 and 12 are connected in parallel to a common terminal on the loudspeaker 24, while the other terminal is grounded. This is referred to as a "parallel" configuration. The parallel configuration delivers twice the current at the same voltage as the half-bridge configuration, which is useful for driving smaller impedances at the same power level as the BTL configuration. For example, if the half-bridge is optimized to provide 500 W to a 4Ω load, the current required to provide the same power into a 2Ω load or the voltage required to provide the same power to an 8Ω load may be at or beyond the limits of the amplifier. The parallel configuration can drive 500 W into a 2Ω load with half the dissipation of the single half-bridge, or drive a full 1 kW if each half-bridge can handle the current. The BTL configuration, on the other hand, can drive 500 W into an 8Ω load without approaching its voltage limits, or drive a full 1 kW if the voltages are available.

In FIG. 1D, four amplifiers 10, 12, 14, and 16 are used, with a parallel pair of amplifiers connected to each terminal of the loudspeaker 26. One pair, 10 and 12, is driven with the opposite signal of the other pair, 14 and 16. This is referred to as a parallel-bridged configuration, and delivers twice the voltage and twice the current as a single half-bridge, for four times the power. Using the same example as above, if each half-bridge is optimized for 500 W at 4Ω, the parallel-bridged configuration can deliver 2 kW to a 4Ω load, with the same voltage and current per amplifier stage.

Various types of amplifiers may be employed for the topologies presented in FIG. 1A-D, including class D amplifiers for which the amplifying devices (e.g., a pair of metal-oxide-semiconductor field-effect transistors—MOSFETs) operate as electronic switches, and not as linear gain devices. The devices operate by rapidly switching back and forth between the supply rails, being provided a pulse train with an encoded audio signal. Using a low-pass filter, an output audio signal is attained and can be provided to a loudspeaker. Since the pairs of amplifying devices generally don't conduct at the same time, most current flows to the low-pass filter and loudspeaker, thereby providing relatively high efficiency (e.g., 90%).

Figure 2:
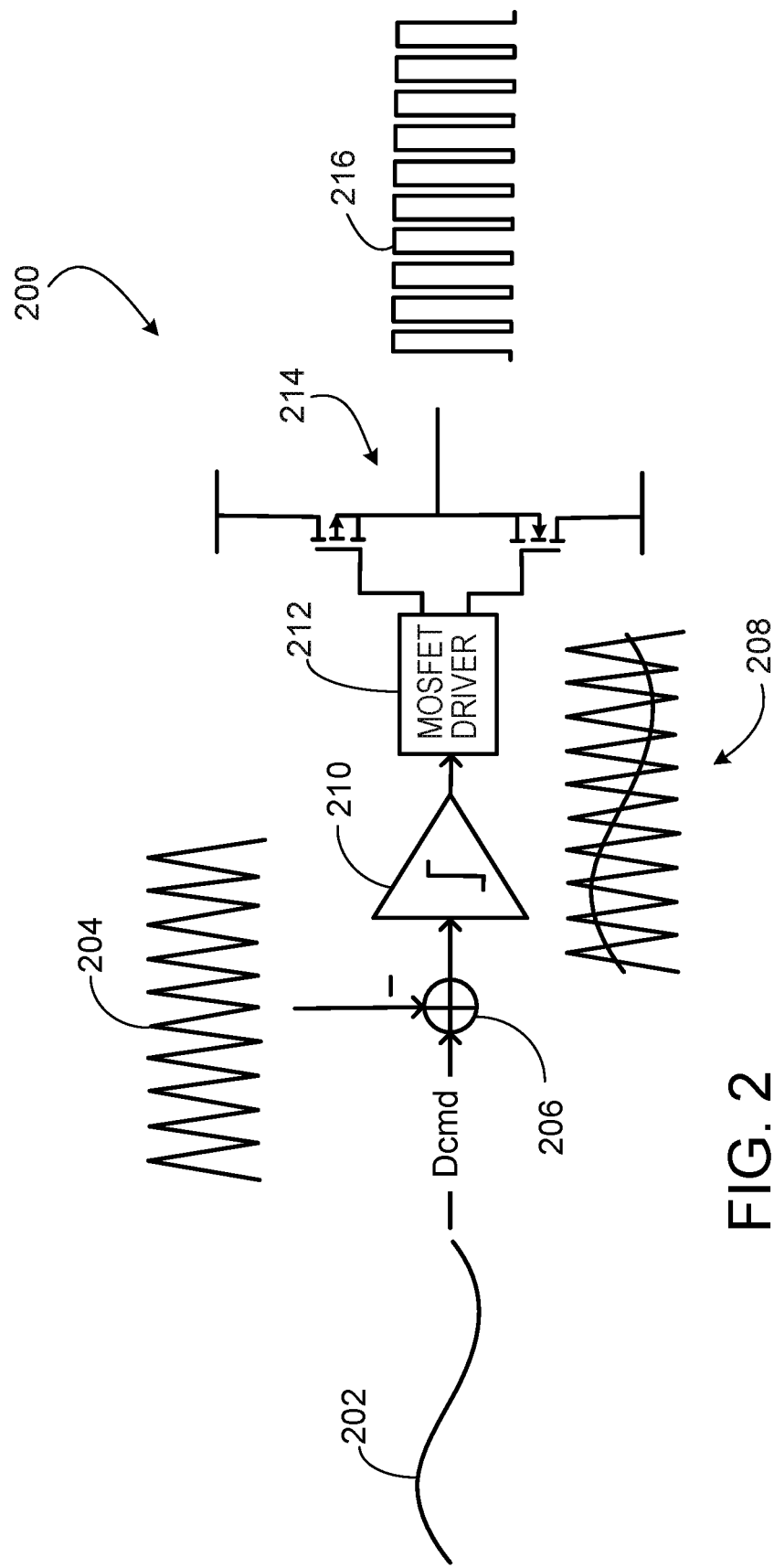
FIG. 2 shows a circuit diagram of an open loop switching amplifier.

Referring to FIG. 2, a circuit diagram of an open loop constant frequency switching amplifier 200 is shown in which an input signal 202 and a triangle signal 204 are provided to a summer 206 (with the triangle signal being inverted by the summer). The output of the summer 206 (represented by waveform 208) is provided to a comparator 210 which compares the two signals and produces a signal (e.g., a pulse-width modulation (PWM) signal) that is provided to a MOSFET driver 212 that controls operations of a MOSFET pair 214. An output signal 216 produced by the MOSFET pair 214 can be used for providing an amplified version of the input signal (e.g., through output filtering) to a loudspeaker. Typically, an oscillator or similar electronic circuitry is used to generate the triangle wave 204, which requires additional components, power consumption beyond the components of the switching amplifier 200.

Figure 3A:
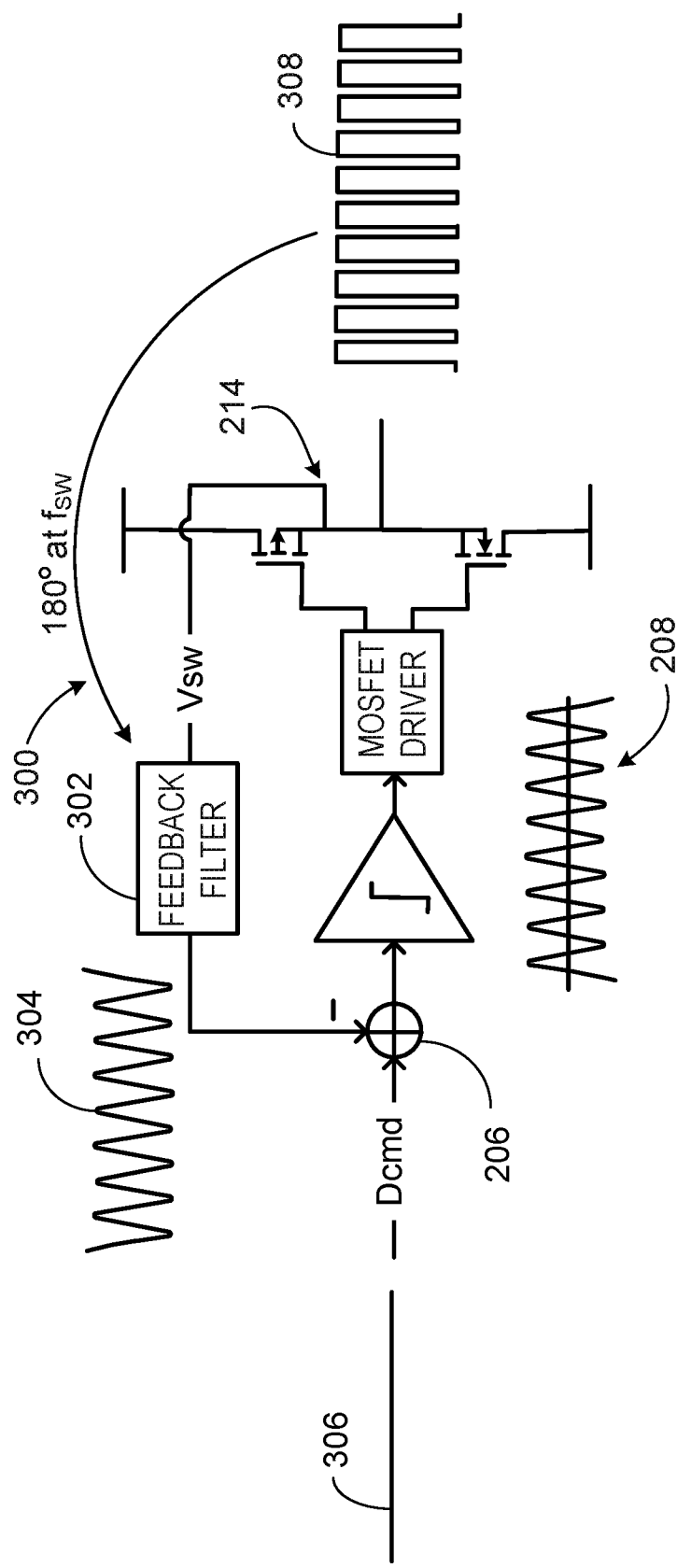
FIGS. 3A and 3B show circuit diagrams of a self-oscillating amplifier.
Figure 3B:
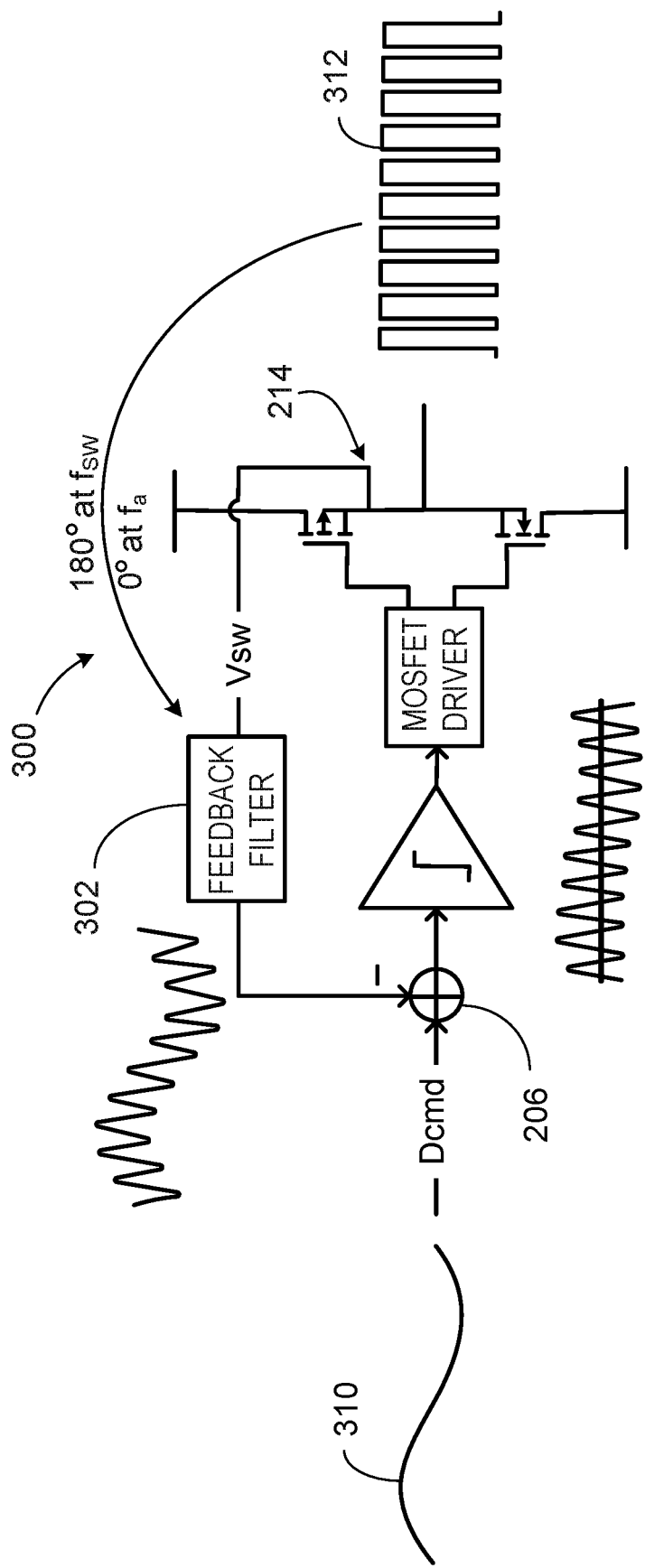

Referring to FIG. 3A, a feedback loop 300 is introduced that connects the output of the MOSFET pair 214 and provides a feedback signal to the summer 206. A feedback filter 302 in the feedback loop 300 filters the output of the pair to generate a signal 304 that can replace the triangle signal (shown in FIG. 2) and need for additional circuitry to produce the triangle signal. In this example, the phase delay of the signal 304 is 180 degrees (at the switching frequency of the MOSFET pair 214); however, another 180 degrees is provided by the summer 206, which causes a zero degree phase shift. FIG. 3A presents the situation in which a zero-level input signal 306 is provided to the summer 206, which results in a zero-level output signal (e.g., 50% duty cycle signal) 308. Referring to FIG. 3B, a varying input signal 310 is shown that correspondingly causes the output of the MOSFET pair 214 to change (the duty cycle of the output signal varies) along with the feedback signal provided by feedback back loop 300. By replacing the independently created triangle signal with a feedback signal (e.g., a sinusoidal signal, a distorted sinusoidal signal, etc.) the amplifier is considered to be self-oscillating and employs a self-oscillating feedback loop.

Figure 4:
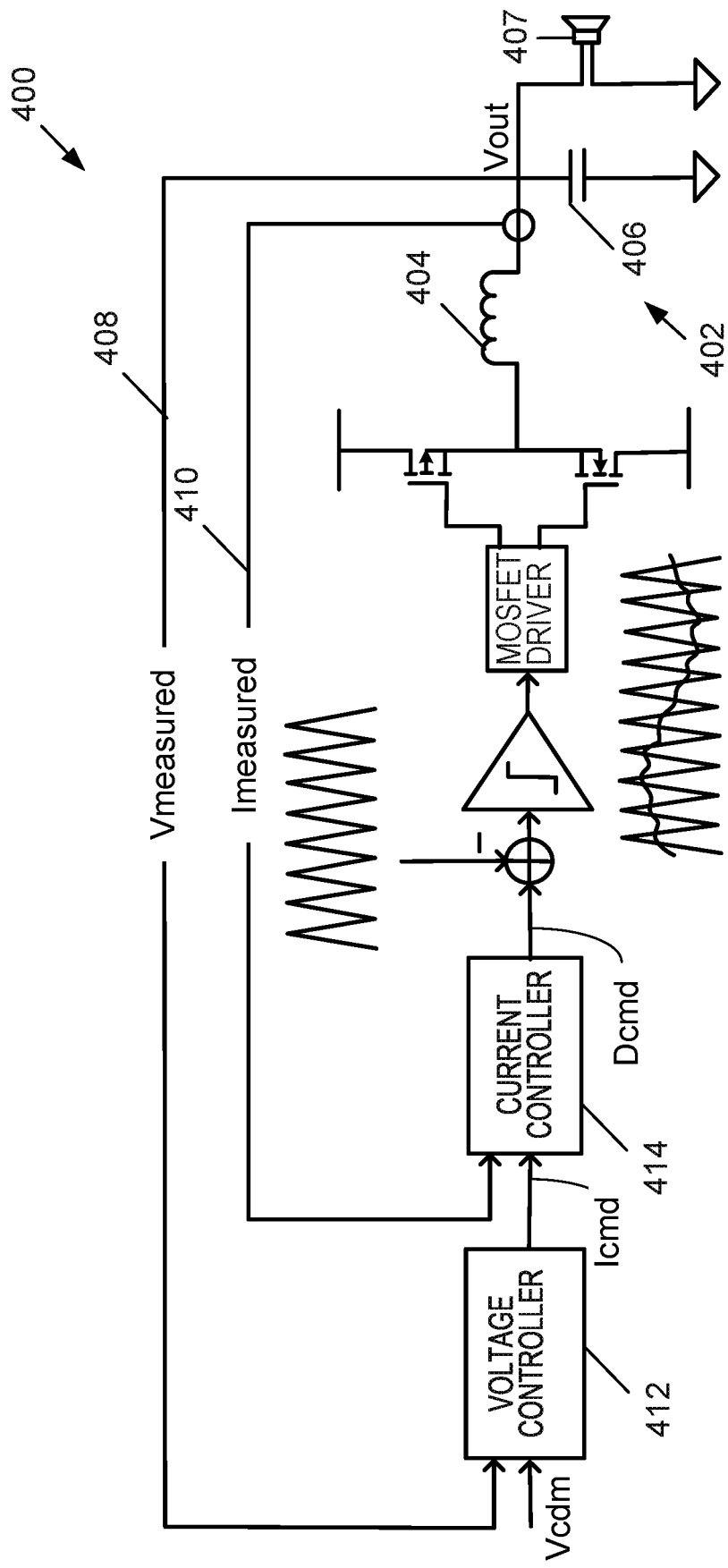
FIG. 4 shows a circuit diagram of an amplifier with a voltage feedback loop and a current feedback loop.

Referring to FIG. 4, other types of feedback loops can be employed to improve amplifier performance. In the illustrated example, a Class D amplifier 400 includes an output filter 402 (e.g., including an inductor 404 and capacitor 406) that is used to establish two feedback loops 408, 410 along with providing an output signal (e.g., to a loudspeaker 407). Voltage is measured from the capacitor 406 (of the output filter 402) and is provided, via the feedback loop 408, to a voltage controller 412. The feedback voltage can be considered the output voltage of the amplifier, i.e., the voltage across the load, which is the same voltage across the output filter capacitor (e.g., capacitor 406 in this figure). In general, the voltage feedback loop 408 assists in controlling the output voltage of the amplifier 400 (e.g., the voltage controller produces a control signal for controlling the output voltage). Current flowing through the inductor 404 (of the output filter 402) is measured and provided, via the feedback loop 410 to a current controller 414. The output load current is equal to the output filter inductor current (e.g., inductor 404) in combination with the output filter capacitor current (e.g., capacitor 406). For frequencies below the output filter corner frequency (approximately 40 kHz) the output filter capacitor current is nearly zero except for a switching ripple current (e.g., the audio band inductor current is approximately equal to the output load current). By using two feedback variables, voltage feedback and current feedback, the two quantities can be considered independent state variables. Some audio systems, topologies (as shown in FIG. 1), etc. use multiple parallel output channels; however, there is a possibility that one of the paralleled channels may carry more current that one or more of the other channels. Without equal sharing of current among the output channels, electronic components included in the higher current carrying channel can become overstressed and potentially fail. By introducing the feedback path 410, the output of the Class D amplifier can be controlled (e.g., by the voltage controller 412 and current controller 414) to assure that an appropriate voltage and current is provided at the output of the amplifier.

In the illustrated example, the voltage feedback loop 408 is located outside of the current feedback loop 410 and the control signal (labeled "Icmd") is generated by the voltage controller 412 is provided to the current controller 414. The current feedback loop 408 generates a control signal ("Dcmd") via the current controller 414 that uses "Icmd" so a desired current is generated in the inductor 404 to produce a desired output voltage. In this example, an independently generated triangle signal is used for oscillation control. By using the voltage feedback loop 408 and the current feedback loop 410, the second order output filter 402 (that includes the inductor 404 and the capacitor 406) can be considered as being transformed into a series combination of two first order systems (e.g., from the duty cycle of a power stage to the inductor current, and, from the inductor current to the output voltage).

Figure 5:
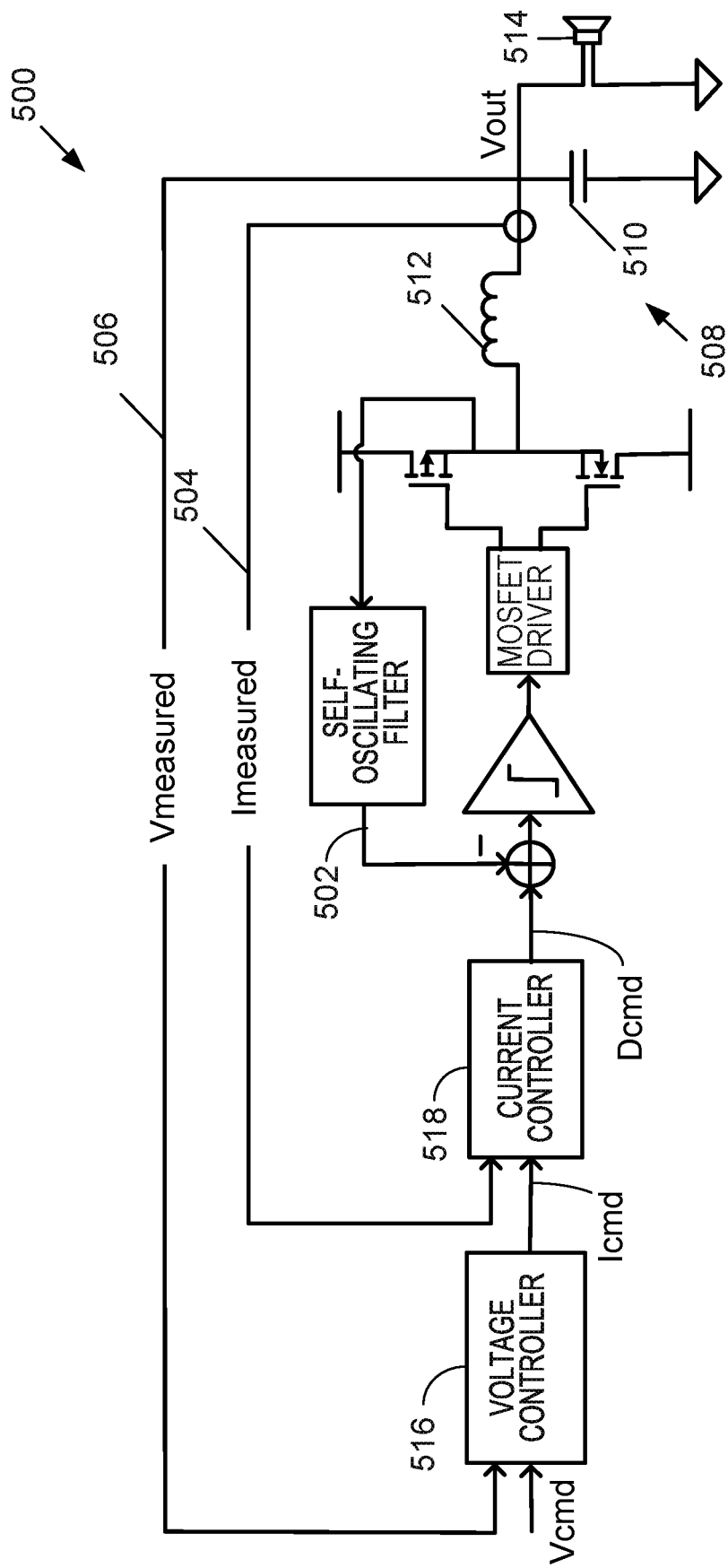
FIG. 5 shows a circuit diagram of a self-oscillating amplifier with a voltage feedback loop, a current feedback loop, and a self-oscillating feedback loop.

As provided by FIGS. 3 and 4, three different feedback loops can be employed for improving performance: a self-oscillating loop, a voltage feedback loop, and a current feedback loop. Referring to FIG. 5, a Class D amplifier 500 is shown that includes three feedback loops: a self-oscillating loop 502, a current feedback loop 504, and a voltage feedback loop 506. Similar to previously presented loops, voltage and current is measured from components of a filter 508 (e.g., voltage is measured from a capacitor 510 for the voltage feedback loop 506 and current flowing through an inductor 512 is measured for the current feedback loop 504). Along with providing these feedback signals, the filter 508 also provides an output signal to a speaker 514. In this arrangement, the voltage feedback loop 506 is located outside the current feedback loop 504 (e.g., a current control signal "Icmd" is generated by a voltage controller 516 and provided to a current controller 518).

By employing the self-oscillating loop 502, a separate oscillator is not needed to generate a triangle signal. Thereby less components, circuitry, etc. are needed and reliability improves. Further improvements can also be realized by combining the functionality of two of these feedback loops. For example, signal artifacts present in the current feedback loop may be used to provide the functionality of the self-oscillating feedback loop. As such, the self-oscillating loop can be combined (e.g., integrated) with the current feedback loop.

Figure 6:
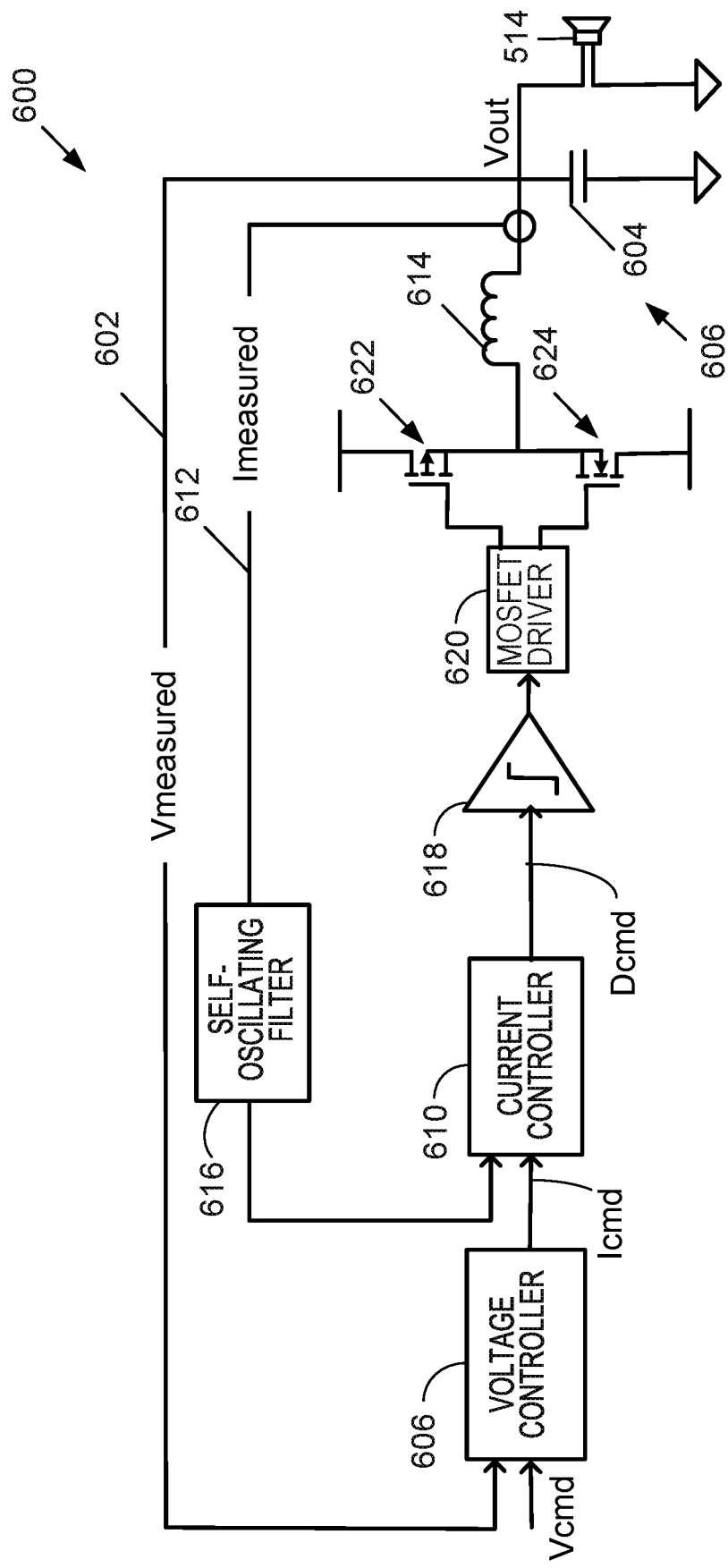
FIG. 6 shows a circuit diagram of a self-oscillating amplifier with a voltage feedback loop and a combined current and self-oscillating feedback loop.

Referring to FIG. 6, a Class-D amplifier 600 is shown that includes two feedback loops, and one of the loops provides multiple functions. An outer voltage feedback loop 602 measures voltage from a capacitor 604 (of a filter 606) and the voltage is provided to a voltage controller 608. Similar to the amplifier 500 (shown in FIG. 5), the voltage controller 608 receives the measured voltage and generates a control signal "Icmd" (that is provided to a current controller 610). Combined feedback loop 612 provides the functionality of a current feedback loop and a self-oscillating feedback loop. In this example, the combined feedback loop 612 provides a measure of the current flowing through an inductor 614 (included in the filter 606) to the current controller 610 for controlling the output current of the amplifier 600. Along with providing the current measure, the combined feedback loop 612 also includes a self-oscillating loop for generating the signal to control the switching devices (e.g., a pair of MOSFETS). A residual switching ripple signal is present in the combined feedback loop 612 (due to the operation of the switching devices). Typically, in an architecture that uses a dedicated self-oscillating loop (e.g., the Class D amplifier shown in FIG. 5), this ripple signal would be removed (via a filter) from the current feedback loop. However, this ripple signal can be used for self-oscillating (and replace a dedicated triangle reference waveform) thereby allowing the self-oscillating loop to be integrated into the current feedback loop. In particular, rather than filtering to remove the ripple signal, the ripple signal is used to generate a self-oscillating reference waveform. Correspondingly, further savings are realized by removing the need for the filtering components and circuitry. To produce this self-oscillating reference waveform, a self-oscillating filter 616 is included in the combined feedback loop 612 to produce the reference waveform (e.g., a sinusoidal signal, a distorted sinusoidal signal, etc.) for controlling the switching devices. Not filtering out the ripple signal also allows for wider bandwidth and high loop gain in the combined feedback loop. Larger bandwidth of the combined feedback loop allows for gain increases in the voltage feedback loop 602. Such gain increases in the audio band can lead to lower distortion and noise, and better frequency response. Further, by employing two feedback loops rather than three, only two separate frequency ranges (one range for the voltage feedback loop and one for the combined feedback loop) are need for operations rather than three separate operational frequency ranges (e.g., one for each of the voltage, current, and self-oscillating feedback loops). By conserving spectral needs, less loop interference may occur.

The illustrated example, the current feedback loop and the self-oscillating feedback loop are combined; however, other combinations may be realized. For example, a combined feedback loop maybe developed that includes the functionality of a voltage feedback loop and a self-oscillating feedback loop. In such an architecture, a current feedback loop may be positioned outside the combined feedback loop (that includes the voltage feedback loop and the self-oscillating feedback loop). Other implementations of may also be realized.

To assure that the self-oscillating loop of the combined feedback loop 612 appropriately operates, some conditions typically need to be satisfied. For example, two conditions can be defined that are associated with the switching frequency ($f_{sw}$) of the Class D amplifier. For one condition, an 180° phase shift (an open loop phase crossover) occurs at the switching frequency ($f_{sw}$) of the amplifier. A second condition, which is a derivable constraint, can be an open loop gain of −6 dB occurs at $f_{sw}$ for the self-oscillating loop of the amplifier. Referring to FIG. 6, the self-oscillating loop can be defined by the loop components, for example, the self-oscillating loop includes the comparator, the MOSFET driver, switching devices (e.g., MOSFETS), and the self-oscillating filter. Other components may also be included in the self-oscillating loop based upon the component that connects and provides input to the self-oscillating filter 616. For example, as shown in figure, one end of the inductor 614 (of filter 606) is connected to the self-oscillating filter 616 and would be included in the loop. In this example, the self-oscillating loop includes the comparator 618, the MOSFET driver 620, switching devices 622, 624, the inductor 614 and the self-oscillating filter 616. But regardless of the connection, an open loop gain of −6 dB is to be maintained at $f_{sw}$. By satisfying these conditions, the combined feedback loop 612 can provide self-oscillation for the amplifier 600 in addition to controlling the current of the inductor 614 (e.g., for limiting current, current sharing with different channels, etc.).

One or more techniques may be employed to satisfy these conditions. For example, to provide a −180° phase shift at $f_{sw}$, a portion of the phase shift (−90°) can be provided by including the inductor 614 in the self-oscillating loop (as shown in FIG. 6) and another portion of the phase shift by other components (e.g., −90° from self-oscillating filter 616). Designing in propagation delay can drive the phase below −180° at frequencies above $f_{sw}$ while the lead network is the network that provides for phase advance, i.e., phase boost below $f_{sw}$ i.e. around gain crossover where the open loop gain is 0 dB. Adjustments can also be made in the audio band by a current controller (e.g., the current controller 610) operate at low frequencies to reject disturbances or increase gain at frequencies at the higher end of the audio band for less distortion and faster phase recovery. Other design conditions typically include having the phase response be above −180° for a 0 dB gain. Margins can also be used for some design parameters. For example, a 30° to 40° phase margin may be added for stability. Gain margins may also be employed (e.g., a gain margin at a phase of −180°).

Figure 7:
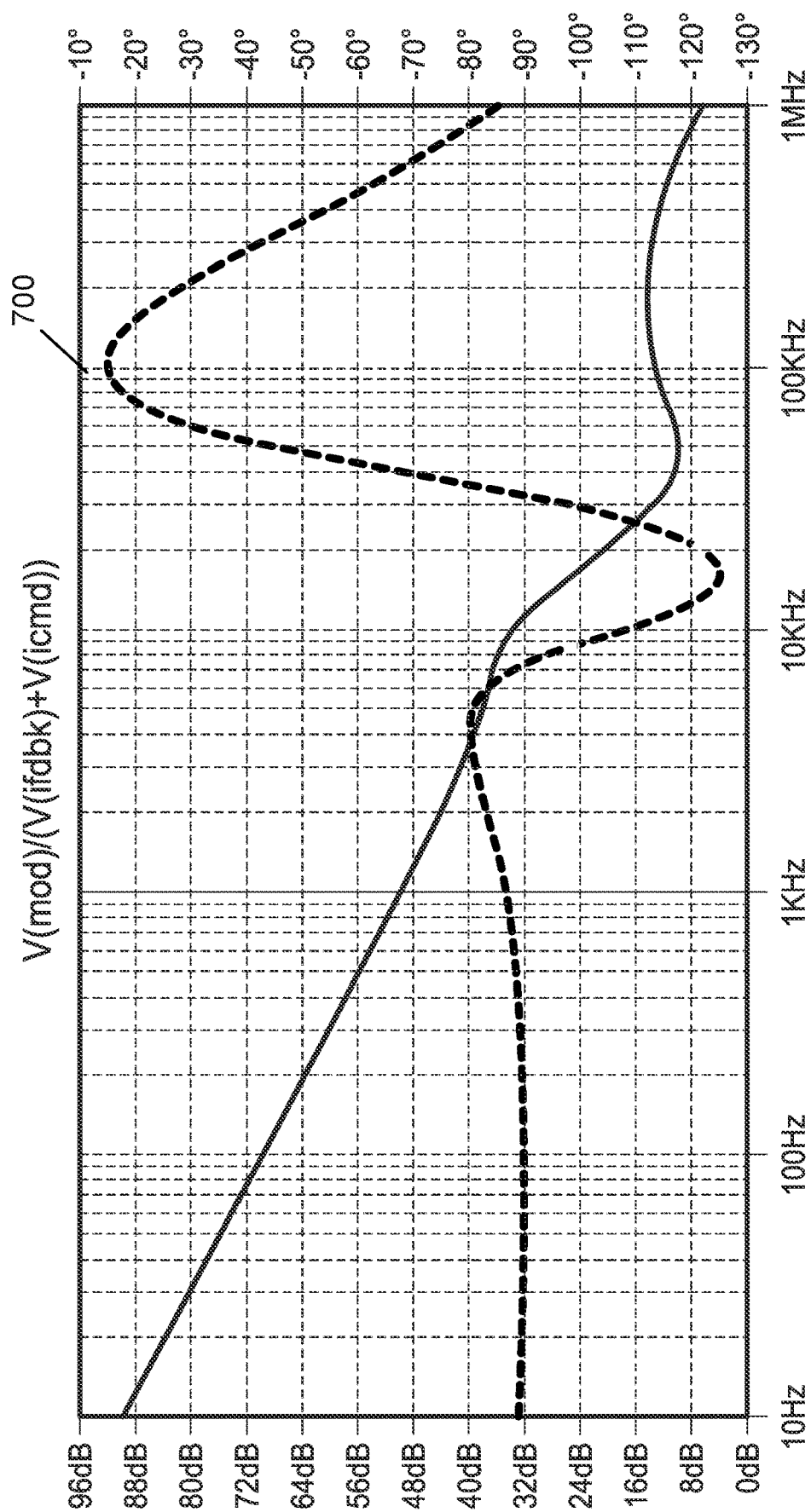
FIG. 7 shows a response of a self-oscillating filter and current loop controller.
Figure 8A:
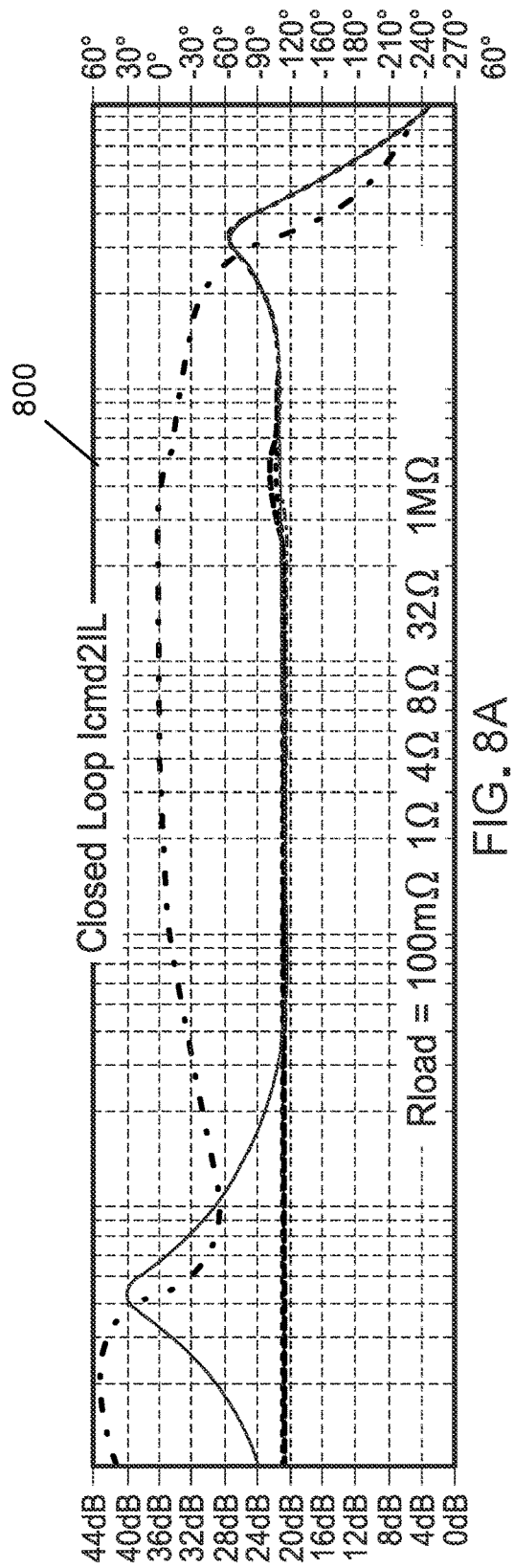
FIGS. 8A and 8B show open and closed loop response of a current feedback loop/self-oscillating loop.
Figure 8B:
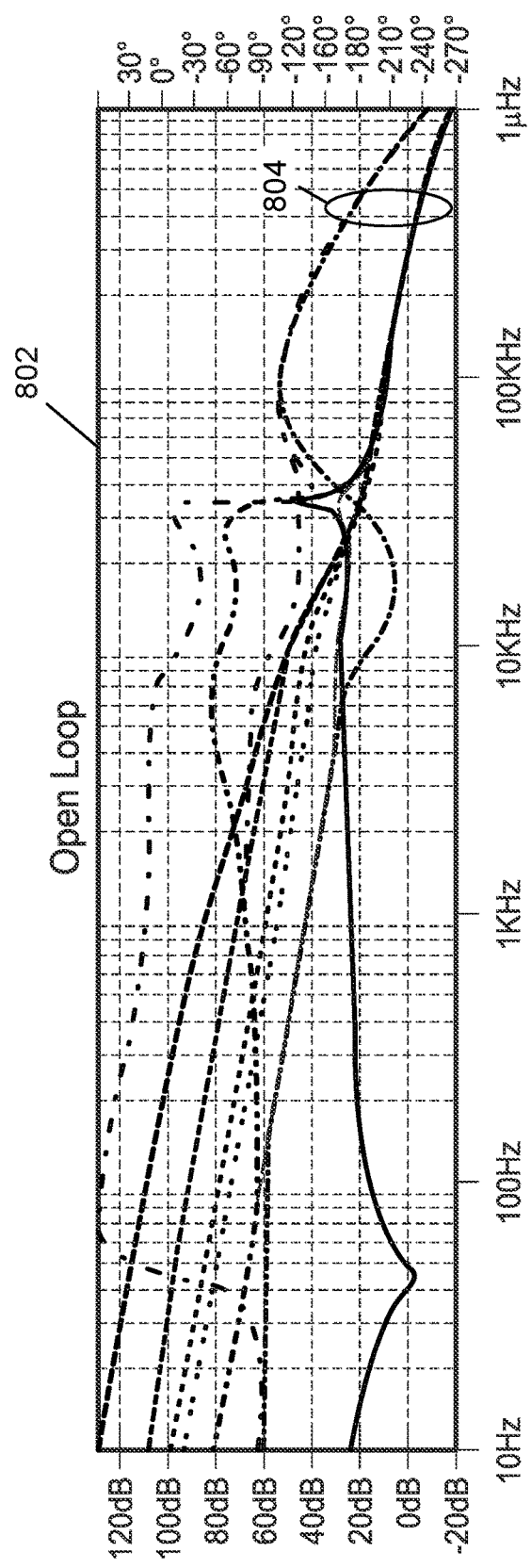

Referring to FIG. 7, a chart 700 is shown that represents the performance of a portion of a combined feedback loop (i.e., a current feedback loop with an integrated self-oscillating loop) that satisfies the conditions identified above. In particular, chart 700 represents the combined frequency response of the self-oscillating filter and current controller. The chart includes both magnitude and phase response (versus frequency) of a self-oscillating filter (e.g., the self-oscillating filter 616) and a current controller (e.g., the current controller 610). To provide the response of an entire current feedback loop including the integrated self-oscillating feedback loop (e.g., the current feedback loop 612), FIG. 8A provides magnitude and phase response for the loop components of the combined feedback loop 612 (e.g., the self-oscillating filter 616, the current controller 610, comparator 618, MOSFET Driver 620, switching devices 622 and 624, and inductor 614). This is the closed loop response from Icmd to the inductor 614. A chart 800 represents the closed loop response of the combined feedback loop and traces are provided for a range of load values (e.g., 100 milli-Ω, 1Ω, 4Ω, 8Ω, 32Ω, and 1 Mega-Ω). FIG. 8B presents a chart 802 that provides the open loop magnitude and phase responses for the combined feedback loop 612 (e.g., the self-oscillating filter 616, the current controller 610, comparator 618, MOSFET Driver 620, switching devices 622 and 624, and inductor 614). The same load values used to compute the closed loop response are also used for computing the open loop response.

The open loop response in chart 802 demonstrates that the responses are nearly load value independent for frequencies above 100 kHz. The open loop response also shows the earlier defined constrains as being satisfied. As indicated with the circular graphic 804, the open loop phase shift of −180° corresponds to the −6 dB of open loop gain at the switching frequency of the amplifier (slightly more than 400 KHz). The circular graphic 804 also indicates approximately 40° of phase margin (i.e., phase is 40° above −180°) at gain=0 dB. Typically these conditions are needed for stability with enough margin. Chart 800 reports that the closed loop response is substantially load independent across nearly all frequencies (with the 1 Mega-Ω load being an outlier). This outlier occurs at low frequencies because the open loop gain drops below 20 dB. This is related to the specific implementation of the inductor current sensing circuit and can be avoided but was included because open load (i.e. 1 MegaOhm) performance in terms of disturbance rejection is not critical as long as stability is maintained. Along with using particular conditions, parameters, etc. for designing the combined feedback loop (e.g., combined feedback loop 612), design choices may also be made for the outer voltage feedback loop. For example, to maintain the performance of the self-oscillating current loop, the outer voltage loop of the amplifier can be designed with limited gain at the switching frequency to reduce interference.

By integrating one feedback loop (e.g., a self-oscillating feedback loop) into a second feedback loop (e.g., a current feedback loop), a switching ripple signal can be exploited that results in no additional oscillator being needed to generate a triangle reference waveform. Further since the switching ripple signal provides a reference signal (e.g., a sinusoidal, distorted sinusoidal, etc.), components previously used for filtering the ripple signal can be removed from the design (which can increase gain). Additionally bandwidth increases that can lower distortion. Also larger bandwidth in the current feedback loop allows boosting the gain of the voltage feedback loop (e.g., in the audio band) that can lead to lower distortion and noise along with an improved frequency response. Filter removal typically means reduce components count, which has its own advantages.

Along with controlling output current of the amplifier, introducing a current feedback loop allows for current sharing among multiple amplifiers. For example, two self-oscillating class D amplifiers to be connected in parallel to share load current. By this design, twice the current is provided at the same voltage. Further, twice the power can be delivered to a 50% lower impedance speaker. A current feedback design also allows for current limiting. For a half-bridges power stage design, current limiting provided by a current feedback loop is common to both of half-bridges (and does not limit current independently for each of the half-bridges of the power stage—which can cause reliability issues when output filter inductors are coupled). Clipping entry and exit generally occurs smoothly when employing a current feedback loop.

Figure 9:
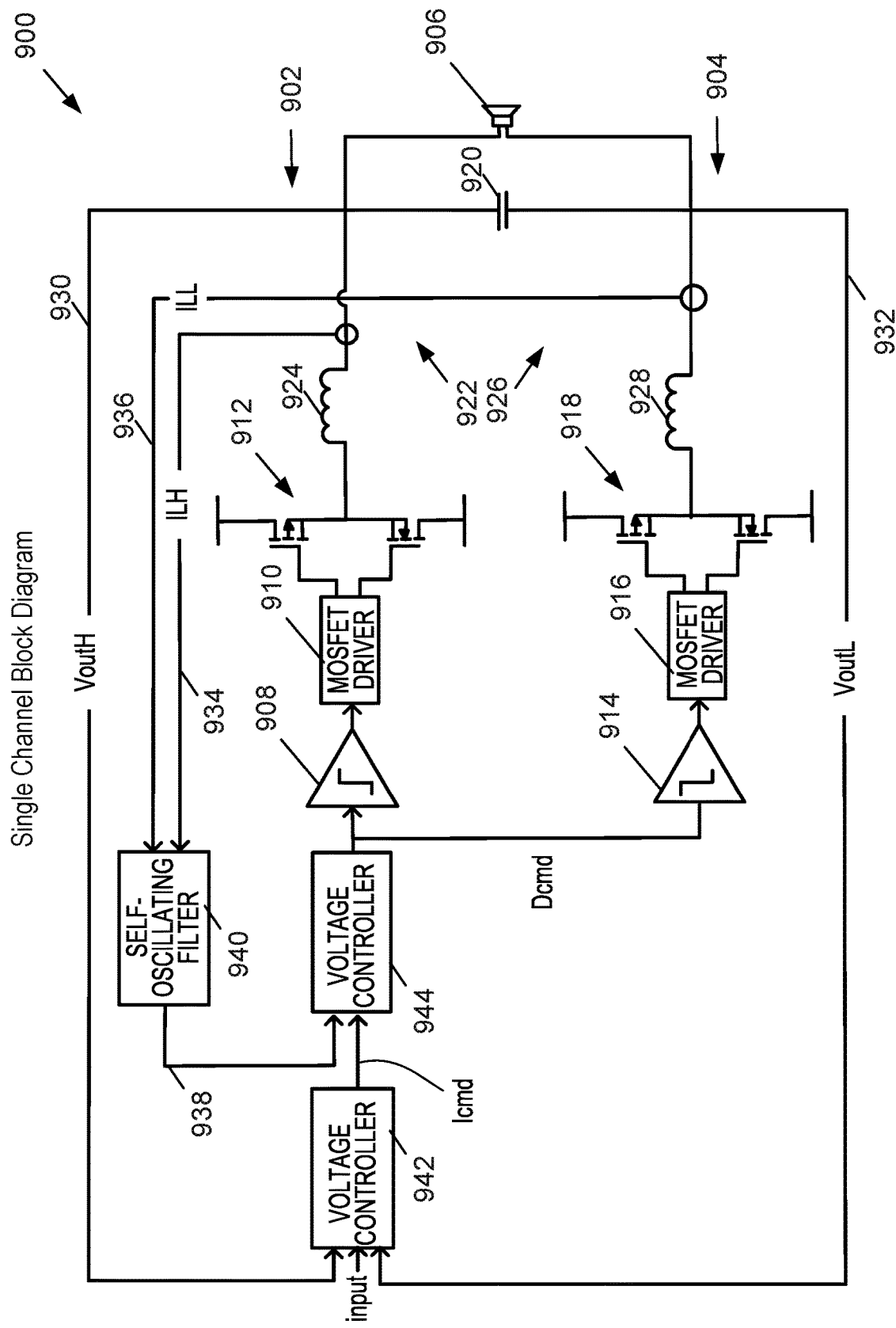
FIG. 9 shows a single channel self-oscillating amplifier with a combined current and self-oscillating feedback loop using differential output stage or full bridge output stage.

Referring to FIG. 9 a single channel block diagram 900 is shown in which a full-bridge configuration uses a combined current feedback loop and self-oscillating feedback loop. With reference to FIG. 1B, two amplifiers 902, 904 are each connected to each terminal of a loudspeaker 906. In this example, each amplifier 902, 904 have separate power stages (e.g., amplifier 902 includes comparator 908, MOSFET Driver 910, switching devices 912, and, amplifier 904 includes comparator 914, MOSFET Driver 916, switching devices 918). Each amplifier has a filter that share a capacitor 920 (e.g., filter 922 includes inductor 924 and capacitor 920, and, filter 926 includes inductor 928 and capacitor 920). Each amplifier has a separate outer voltage feedback loop (e.g., voltage feedback loop 930 is used by amplifier 902, and, voltage feedback loop 932 is used by amplifier 904) that connect to the shared capacitor 920. Similarly, two current feedback loops are used, current feedback loop 934 is used by amplifier 902 and current feedback look 936 is used by amplifier 904. A self-oscillating feedback loop 938 is integrated into each of the current feedback loops (e.g., a common self-oscillating filter 940 is used by both current feedback loops). From a voltage controller 942 (that is connected to both voltage feedback loops 930 and 932) and a current controller 944, common current commands are used by each of the amplifiers 902 and 904 to produce the single channel. By parallelizing, additional channels can be introduced may or may not share commands for current generation. Through command sharing, an equivalent current can be provided by each channel (e.g., two channels each provide the same current). By maintaining the same current across two (or more) channels, overstressing of individual channels (e.g., due to parasitic effects) can be reduced.

Figure 10:
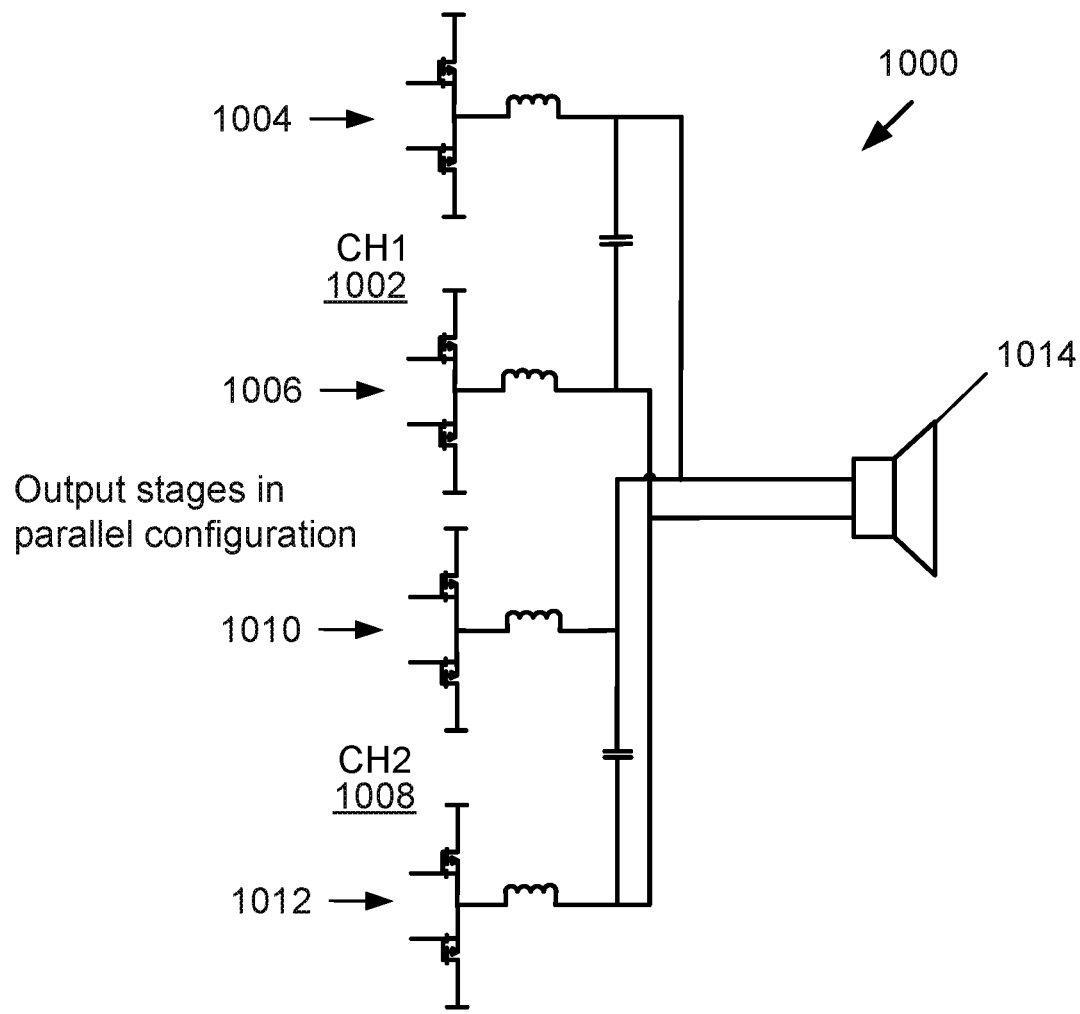
FIG. 10 shows a two-channel amplifier stage in parallel configuration to double output current.

Referring to FIG. 10, a two-channel configuration 1000 is presented in which two channels are connected in a parallel. A first channel 1002 includes two output stages 1004 and 1006, and similarly a second channel 1008 also includes two output stages 1010 and 1012. In this particular example, the channels 1000, and 1002 are hardwire connected in parallel to a loudspeaker 1014. As such, hardware adjustments (e.g., changing jumper leads) are needed to adjust some functionality (e.g., placing the same input on both channels).

Figure 11:
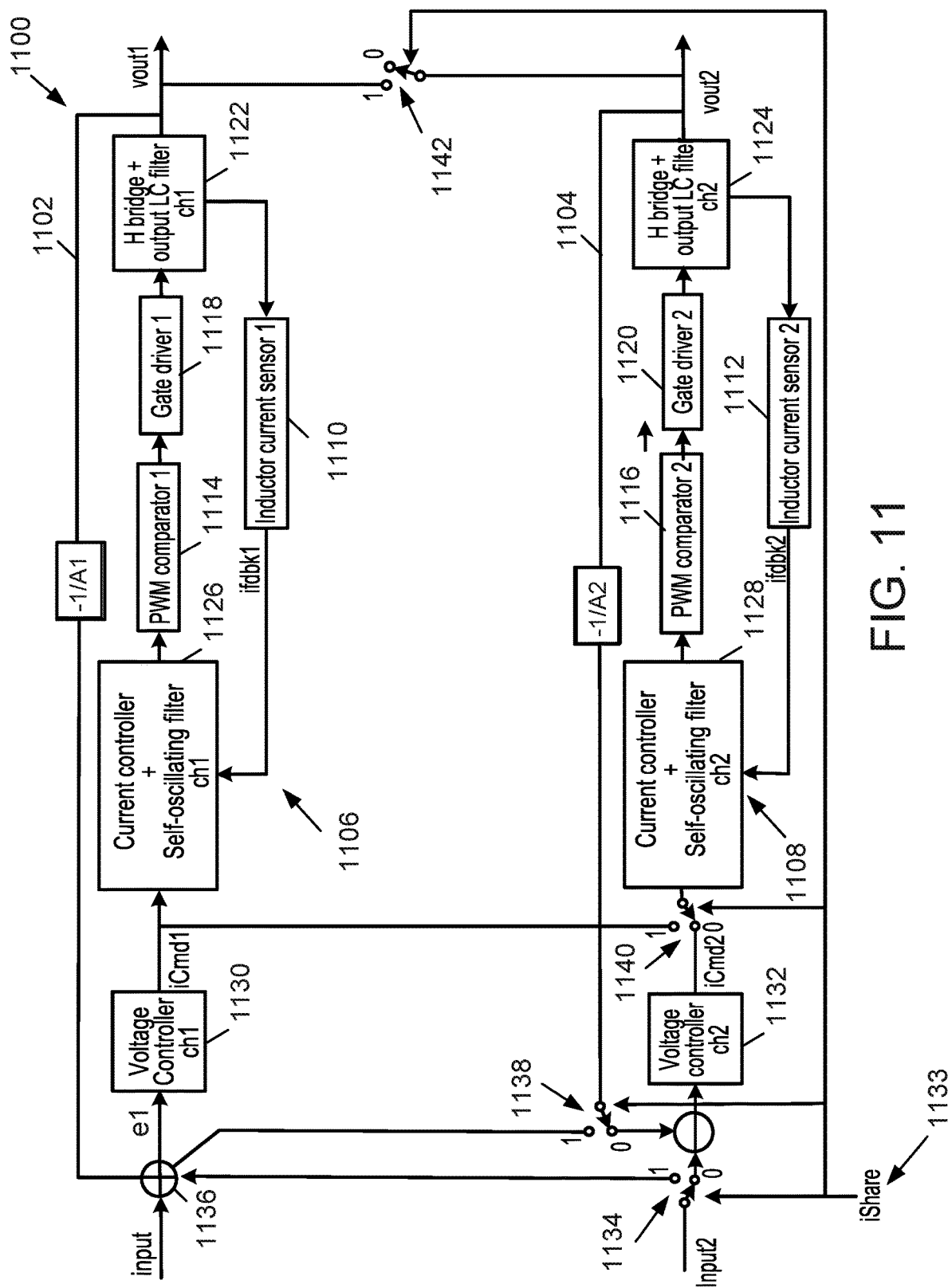
FIG. 11 shows a two-channel self-oscillating amplifier for paralleling of outputs and stereo to mono conversion.

Referring to FIG. 11, a parallel two-channel configuration 1100 is presented in which a switching network allows both channels to be independently controlled or controlled together. As illustrated in the figure, a mode (referred to as "iShare") defined when the channels operate independently or together. When inactive (iShare is inactive), independent current commands control the channels (one command is used to control one channel, and, an independent command is used to control the second channel). When the iShare mode is active, both channels are controller in the same manner (e.g., the same current command is used to control both channels). In this active mode, equal current sharing can occur between the two channels (e.g., so one channel is not stressed more than the other—due to parasitic effects). Additionally, when iShare is active the outputs of the channels are connected in parallel, and when inactive each output is independently provided. The iShare inactive mode can also be considered as placing the configuration 1100 in a stereo mode (since each channel is independent). When in iShare mode, parallel channels share the same load and each channel carries one half of the total load current. In effect, the load current is doubled when iShare is active (compared to when iShare is inactive). The load current is determined by the load (because the load current=V/R). The smaller the load R, the larger the current. For example, when iShare is inactive, a 4Ω is on each channel. But when iShare is active two 4Ω loads are in parallel (which equals 2Ω). If voltage does not change, twice the current is present compared to a 4Ω being on a signal channel. Or, iShare can be inactive with 4Ω load on one channel and open load on another channel. The open load channel carries no current. When iShare becomes active, a parallel combination of the open load and the 4Ω load produces a 4Ω load. However, now each channel carries half of the current compared to the single channel with the 4Ω load.

In this example, both channels have an outer voltage feedback loop (e.g., loop 1102 for channel 1 and loop 1104 for channel 2) and an inner combined current feedback loop and self-oscillating loop (e.g., combined loop 1106 for channel 1 and combined loop 1108 for channel 2). Each combined loop 1106, 1108 includes a current sensor 1110, 1112, a comparator 1114, 1116, a gate drive 1118, 1120, an H bridge and output filter 1122, 1124, and a combined self-oscillating filter and current controller 1126, 1128. Each channel also includes a voltage controllers, controller 1130 (for channel 1), 1132 (for channel 2).

To move between iShare being active and inactive, an iShare control signal 1133 is graphically illustrated as controlling the positions of a series of switches. For each switch a value of "1" has been selected to represent when iShare is active and a value of "0" to represent when iShare is inactive. In general, when iShare is inactive, the two channels operate independent, and when iShare is active the inputs of the two channels are combined and used by both channels. With iShare active, switch 1134 provides the input of channel 2 to a summer 1136 (which also receives the input signal of channel 1). When iShare is active, switch 1138 also connects the voltage feedback loop 1104 of the channel 2 to the summer 1136. When iShare is inactive, the voltage feedback loop 1104 is connected by switch 1138 to the voltage controller of channel 2 (for independent channel operations). Switch 1140 assures that a common current command is used by both channels when iShare is active and assures that each channel use separate current commands when iShare is inactive. By using the same current command for both channels, the output currents of each channel are equivalent. Turning to the outputs of the two channels, switch 1142 connects the outputs of the two channels when iShare is active (each channel provides an equivalent output), and disconnects the output when iShare is inactive (each channel provides an independent output).

When iShare is active, the inner combined current feedback/self-oscillating loops 1106, 1108 control the current in the output filter inductor (of the H bridges and output filters 1122, 1124)—which in the audio band is equivalent to half the load current (when iShare is active) and the load current (when iShare is inactive). The combined current feedback/self-oscillating loops 1106, 1108 also provide smooth current clipping when iShare is active or inactive, and equal current sharing between channels when iShare is active. At higher frequencies (above the audio band), the self-oscillating filters of the combined current feedback/self-oscillating loops 1106, 1108 define the switching frequencies for the channels (e.g., which can range from 150 kHz for relative large input signals and to 400 KHz for no signal).

Additional functionality may also be provided by the parallel two-channel configuration 1100; for example, the iShare capability allows switching between a stereo output and mono output. Further, signals can be converted from stereo signals to mono signals. A stereo output can be considered as including multiple channels (e.g., two) in which each channel signal is considered to be independent (e.g., each channel is collected at a different location, etc.). A mono output includes one channel. To convert stereo signals into a mono signal, one or more techniques may be employed, for example, multiple signals may be summed to produce a single mono signal (that is then amplified and output). With regard to iShare, stereo signals can be converted into a mono signal when switching from iShare being inactive to iShare being active. When iShare is inactive, each channel independently processes its input (e.g., the input to channel 1 is processed by channel 1 and the input to channel 2 is processed by channel 2). Each channel then independently outputs its output signal (e.g., the output of channel 1 is output by channel 1, and, the output of channel 2 is output by channel 2). Upon iShare becoming active, the input of channel 1 is added to the input of channel 2 (by summer 1136). With channel 1 and channel 2 having different signals (e.g., stereo signals), one signal (e.g., a mono signal) is produced by the summer 1136. At the summer 1136:

$$\text{input1+input2}-\text{vout1}/A1-\text{vout2}/A2=e1, \text{ where } A1{\approx}A2{\approx}A, \text{ and the feedback loop is designed to regulate } e1{\approx}0. \quad [1]$$

it follows that:

$$\text{vout1+vout2}=A^*(\text{input1+input2}) \quad [2]$$

with iShare active (switch 1142 connects vout1 and vout2):

$$\text{vout1}=\text{vout2}=\text{vout} \quad [3]$$

$$2^*\text{vout}=A^*(\text{input1+input2}) \quad [4]$$

or $$\text{vout}=A^*(\text{input1+input2})/2 \quad [5]$$

So when iShare is active, the output of the configuration 1100 is the average of the two inputs. Further, since the same current command is used in channel 1 and channel 2 when iShare is active, the output current of channel 1 is equivalent to the output current of channel 2.

Figure 12:
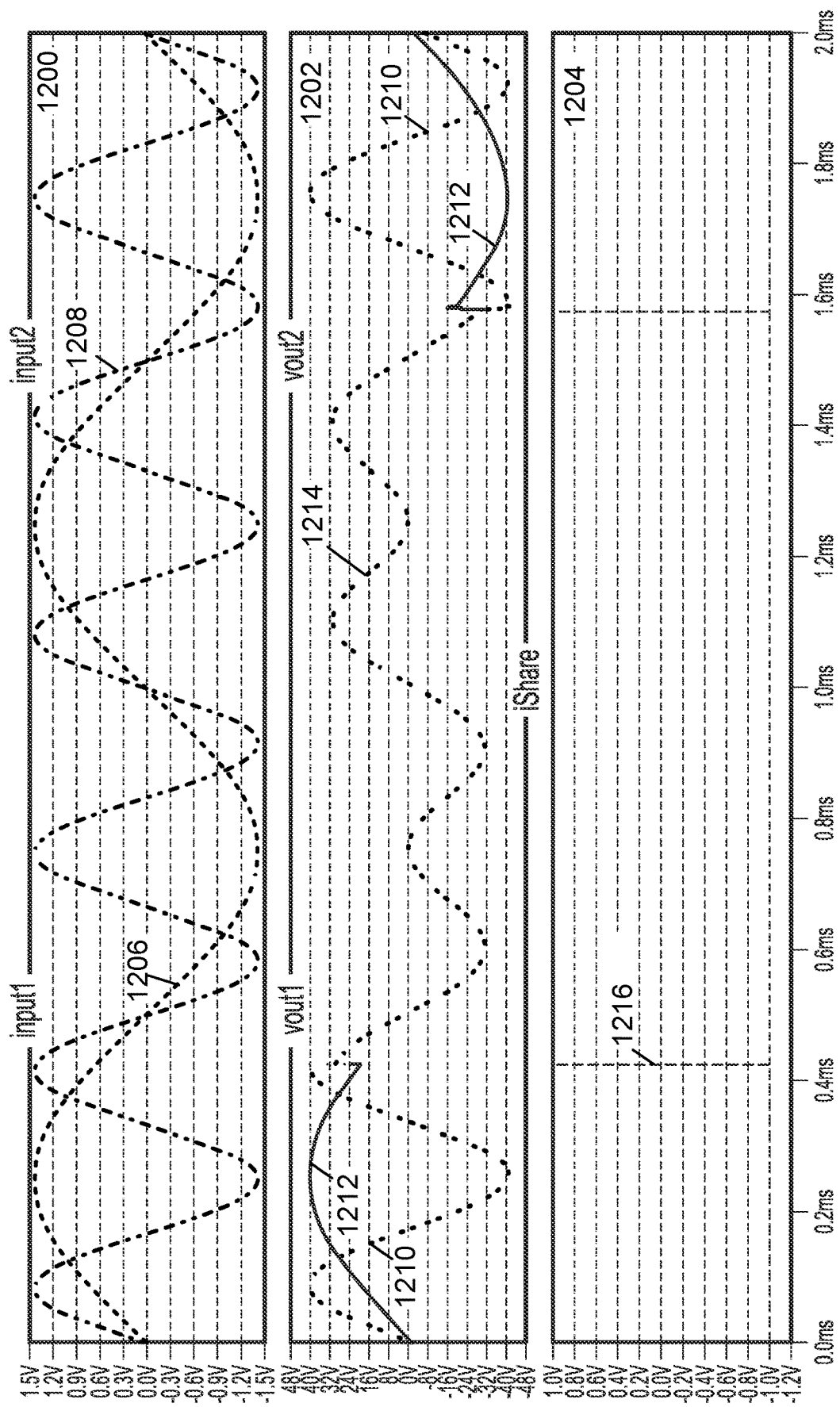
FIG. 12 shows time series traces of signals of the amplifier shown in FIG. 11.

Referring to FIG. 12, three charts 1200, 1202, 1204 presents time series traces that demonstrate the stereo to mono conversion performed by configuration 1100 (shown in FIG. 11) when iShare is active. Chart 1200 presents two traces 1206, 1208 that represent input 1 and input 2. Given that input 1 (trace 1206) has a lower frequency than input 2 (trace 1208), the input can be considered different (e.g., similar to two stereo channel inputs). When iShare is inactive (trace 1216 has a −1.0 volt level), two traces are provided in chart 1202 that represents the output of the configuration 1100. During the time periods that iShare is inactive, output trace 1212 (for channel 1) corresponds to input trace 1206 for channel 1. Additionally, output trace 1210 (for channel 2) corresponds to the input trace for channel 2. When iShare is active (as represented with a 1.0 volt level in trace 1216 in chart 1216), a single trace 1214 in chart 1202 represents the single output. In this example, the trace 1214 represents the average output of the two different input signals 1206 and 1208. As such, a single output (e.g., a mono output) is provided with iShare is active and two separate outputs (e.g., stereo output) is provided when iShare is inactive.

A number of implementations have been described. However, other implementations not specifically described in details may also be within the scope of the following claims.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. An audio power amplifier:
   a first channel and a second channel;
   each of the first channel and the second channel comprising:
   an input to receive an input signal,
   a pair of switching devices,
   drive circuitry for driving the pair of switching devices to produce a signal,
   an output filter to filter the signal from the pair of switching devices, the output filter configured to provide the filtered signal to an audio load,
   a voltage feedback loop to provide a voltage of the filtered signal to a voltage controller of the audio power amplifier, and
   a current feedback loop to provide a current of the filtered signal to a current controller of the audio power amplifier; and
   a summer for combining the input of the first channel and the input of the second channel in response to a signal representing a mode of the amplifier.

2. The audio power amplifier of claim 1, where the first channel input and second channel input are not combined when the filtered signal of the first channel is not connected to the filtered signal of the second channel.

3. The audio power amplifier of claim 1, wherein an average of the first channel input signal and second channel input signal is output by the audio power amplifier when an output of the first channel is connected to the output of the second channel.

4. The audio power amplifier of claim 1, wherein the input signal to the input of the first channel is a first stereo input signal, and the input signal to the input of the second channel is a second stereo input signal.

5. The audio power amplifier of claim 1, wherein the signal representing the mode of the amplifier is used to connect the output of the first channel and the output of the second channel.

6. The audio power amplifier of claim 1, wherein the signal representing the mode of the amplifier is used to connect a current control signal from the first channel to the second channel.

7. The audio power amplifier of claim 1, wherein each of the first channel and the second channel further comprises a self-oscillating feedback loop to provide a timing signal for driving the corresponding pair of switching devices.

8. The audio power amplifier of claim 7, wherein the self-oscillating feedback loop is integrated into the current feedback loop.

9. The audio power amplifier of claim 1, wherein the audio power amplifier is a Class D amplifier.

10. An audio power amplifier:
    a first channel and a second channel;
    each of the first channel and the second channel comprising:
    an input to receive an input signal,
    a pair of switching devices,
    drive circuitry for driving the pair of switching devices to produce a signal,
    an output filter to filter the signal from the pair of switching devices, the output filter configured to provide the filtered signal to an audio load,
    a voltage feedback loop to provide a voltage of the filtered signal to a voltage controller of the audio power amplifier, and
    a current feedback loop to provide a current of the filtered signal to a current controller of the audio power amplifier;
    wherein the audio power amplifier is configured to switch between a stereo mode or a mono mode in response to a control signal, and wherein the input of the first channel and the input of the second channel are combined when the audio power amplifier is placed into the mono mode.

11. The audio power amplifier of claim 10, wherein when the amplifier is placed into the stereo mode, the first channel operates independent of the second channel.

12. The audio power amplifier of claim 10, wherein an average of the first channel input signal and second channel input signal is output by the audio power amplifier when the amplifier is placed into the mono mode.

13. The audio power amplifier of claim 10, wherein when the amplifier is placed into the mono mode, the output of the first channel is connected to the output of the second channel.

14. The audio power amplifier of claim 10, wherein when the amplifier is placed into the mono mode, a current control signal from the first channel is provided for use by the second channel.

15. The audio power amplifier of claim 10, wherein when the amplifier is placed into the stereo mode, one current control signal is produced and used by the first channel and another current control signal is produced and used by the second channel.

16. The audio power amplifier of claim 10, wherein each of the first channel and the second channel further comprises a self-oscillating feedback loop to provide a timing signal for driving the corresponding pair of switching devices.

17. The audio power amplifier of claim 16, wherein the self-oscillating feedback loop is integrated into the current feedback loop.

18. The audio power amplifier of claim 10, wherein the audio power amplifier is a Class D amplifier.

* * * * *